United States Patent [19]

Maeno

[11] Patent Number: 5,400,953
[45] Date of Patent: Mar. 28, 1995

[54] METHOD OF PRINTING A BONDING AGENT

[75] Inventor: Kazuhiro Maeno, Kariya, Japan

[73] Assignee: Kabushiki Kaisha Toyoda Jidoshokki Seisakusho, Kariya, Japan

[21] Appl. No.: 288,895

[22] Filed: Aug. 10, 1994

Related U.S. Application Data

[63] Continuation of Ser. No. 162,487, Dec. 3, 1993, abandoned.

[30] Foreign Application Priority Data

Sep. 12, 1992 [JP]  Japan .................................. 4-329677

[51] Int. Cl.$^6$ .............................................. H05K 3/34
[52] U.S. Cl. .............................. 228/248.1; 228/180.22
[58] Field of Search ..................... 228/180.21, 180.22, 228/248.1, 33, 41; 427/96, 282; 118/213, 406; 148/24

[56] References Cited

U.S. PATENT DOCUMENTS

| | | | |
|---|---|---|---|
| 4,607,782 | 8/1986 | Mims | 228/248.1 |
| 4,739,917 | 4/1988 | Baker | 228/248.1 |
| 4,821,946 | 4/1989 | Abe et al. | 228/248.1 |
| 4,953,460 | 9/1990 | Wojcik | 228/248.1 |
| 5,180,097 | 1/1993 | Zenshi | 228/248.1 |

FOREIGN PATENT DOCUMENTS

| | | |
|---|---|---|
| 1-224160 | 9/1989 | Japan . |
| 2-172293 | 7/1990 | Japan . |
| 3-284895 | 12/1991 | Japan . |

Primary Examiner—Samuel M. Heinrich
Attorney, Agent, or Firm—Brooks Haidt Haffner & Delahunty

[57] ABSTRACT

Lands formed on the top surface of substrate are covered by a printing screen having a printing pattern, in order to mount chip components on the substrate. A paste bonding agent is supplied to the lands through the printing pattern, and a layer of bonding agent is formed on the lands. In the printing method, a plurality of bonding agent layers that are mutually separated are formed on the land. The chip component is placed on the bonding agent layers of the land. As the chip component is pressed to the land, the bonding agent layers are smashed and spread on the land prior to applying heat to said bonding agent layers.

7 Claims, 4 Drawing Sheets

METHOD OF PRINTING A BONDING AGENT

This application is a continuation of application Ser. No. 08/162,487, filed Dec. 3, 1993, now abandoned.

BACKGROUND OF THE INVENTION

1. Field of the Invention

The present invention relates to a method for printing a bonding agent such as a paste solder to lands formed on a printed circuit board in order to bond chip components such as chip condensers to the lands.

2. Description of the Related Art

Generally, chip components such as chip capacitors, chip resistors, etc., are bonded on a printed circuit boards for use in a computer and other devices employing solid state circuitry. To bond those chip components on the printed circuit board, first, paste solder is printed on lands 21 formed on the printed circuit board, as shown in FIG. 9, via a printing screen or mask. The paste solder is typically made by combining grained solders and flux. The chip components are placed on the solder layer printed on the lands, and the solder is molten by reflow soldering, a process wherein the board is heated to make the solder flow. Next, the molten solder is applied to individual chip components to be bonded. Solder fillets 22, as shown in FIG. 9, are formed at the distal portions of the chip components 20 and secure the components 20 to the corresponding lands 21.

However, when the chip components are deposited on the lands 21 containing more than adequate amount of paste solder, the paste solder has a tendency to cover the distal ends of the chip components as illustrated in FIG. 10. Such mishapped solder fillets 22 are particularly susceptible to the formation of cracks due to the difference of thermal expansion coefficients between the printed circuit board and the chip components. With the introduction of cracks in the solder fillets 22, the electrical connection between the soldered components on the printed circuit board may degrade to the point where there is insufficient electrical connection between chip components. This, in turn, results in a decrease in the overall reliability of the printed circuit board. To solve this problem, the amount of solder printed on the lands 21 should be properly adjusted to form and shape solder fillets 22 having the shape shown in FIG. 9.

To maintain proper adjustment to the amount of printed solder, various solder printing methods have been proposed which take into account conditions which often vary from one printing application to the next, such as, printing pressure and mask thickness. However, according to these methods, the solder amount adjustment consists in regulating a single amount of solder formed into fillets 22 for all the lands in a single printing application. Such methods are not designed to account for the amount of solder applied to individual or specific lands. Therefore, the amount of solder to be applied in a particular application is not adjustable with respect to individual chip components having varying heights from the surface of the printed circuit board. As a result, improperly shaped solder fillets can not be avoided.

One proposed solution to the above-described drawback has been to use a method which adjusts the amount of solder applied to every land by partially reducing the outer diameter of each mask opening by a degree smaller than that presented by the relevant portion of the corresponding land.

However, according to this proposed method, the formation of well shaped solder fillets still cannot always be achieved. The reason for this is that an oxide layer, typically formed on the surface of the land, inhibits the flow of molten solder to only those areas of the land from which the oxide layer has been removed. This restriction, in effect, increases the chances of the molten solder fillets 22 covering the individual chip components, since the molten solder is confined to only those specific areas of the land which have been deoxidized, i.e., those portions which will contain printed patterns. When the molten solder is so confined to wetting on the deoxidized area only, the chances are significant that the solder fillet 22 will overlap the chip components. This is due, once again, to the fact that the molten solder is confined by the oxide coating on the land to only those land portions which have been deoxidized by the action of the flux. Consequently, this method suffers from the drawback that solder fillets 22 often can not be formed without covering a portion of the chip components.

Moreover, a further disadvantage of reducing the size of the mask patterns for purposes of maximizing the efficiency of solder deposit occurs due to the frequent mislocation of chip components placed on the printed circuit borard. With the decrease in size of the masking patterns, the amount of solder to be deposited becomes likewise reduced. When, as it is inevitably the case, chip components are placed on the circuit board in a slightly dislocated position, one end of the chip may be soldered in place with a greater amount of solder than the other end of the same chip. When the solder solidifies, the chip component frequently becomes unballanced due to the differing rates of encasement of both chip ends in the solidifying solder. This condition frequently results in the electrical isolation of one end of the chip from the other.

SUMMARY OF THE INVENTION

It is therefore an object of the present invention to provide a method of printing a bonding agent, which enables solder fillets to be formed having well defined fillet shapes and which adjusts the particular amount of bonding agent to be printed on specific lands when the chip components are bonded to the corresponding lands.

It is another object of the present invention to provide a method of printing a bonding agent, which prevents the chip components from becoming unbalanced and dislocated upon solidification of the component ends in the printed solder.

To achieve these objects, a method of printing a bonding agent according to the present invention is disclosed, wherein lands formed on the top surface of a substrate are covered by a printing screen having a printing pattern in order to mount chip components on the substrate. A paste bonding agent is supplied to the lands through the printing pattern, and the layers of bonding agent are formed on the lands, respectively. When the paste bonding agent is supplied to the lands, a plurality of the bonding agent layers, mutually separated from each other, are next precisely and accurately formed on each land. Chip components may then be placed on the bonding agent layers and pressed to the land causing the bonding agent layers to be smashed and spread on the land.

BRIEF DESCRIPTION OF THE DRAWINGS

The invention, together with objects and advantages thereof, may best be understood by reference to the following description of the preferred embodiments together with the accompanying drawings, in which.

DESCRIPTION OF THE PREFERRED EMBODIMENT

A preferred embodiment of the present invention will now be described referring to FIGS. 1 through 4.

Figure 1:
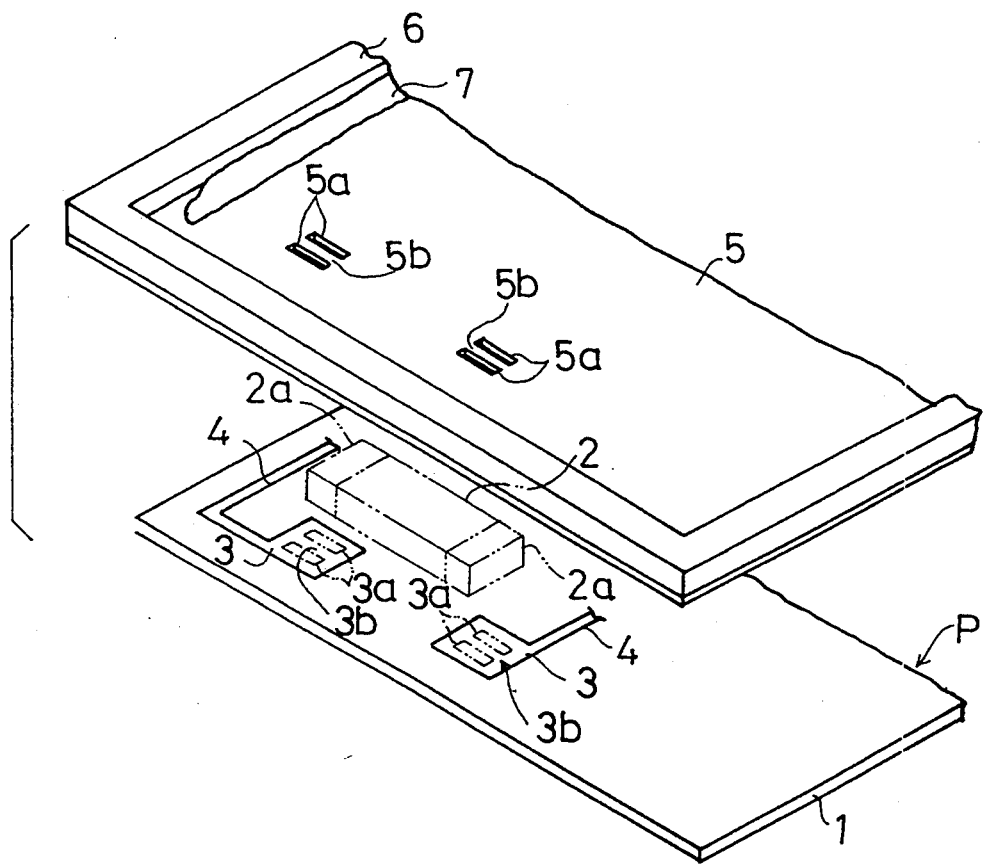
FIG. 1 is a schematic perspective view showing a method for printing a paste solder on a printed circuit board according to a preferred embodiment of the present invention.

As shown in FIG. 1, the construction of printed circuit board P includes an insulating subtrate 1, which is formed essentially from a base material of glass fiber board and epoxy resin. Each substrate 1 has specific thermal, ohmic and insulative characteristics defined by the particular elements with which it is formed. Lands 3 for mounting a chip component 2 (shown by a double dotted line) are formed on the top surface of the insulating substrate 1 by a copper plating method. Two lands 3 are typically used to form a pair that corresponds to terminals 2a located at both ends of chip component 2 such as a condenser or resistor. The terminals 2a of the chip component 2 are bonded to the corresponding land 3 by applying a paste solder thereto. A conducting pattern 4 is formed on the top surface of the substrate 1, and is uniformly applied over and connected with the lands 3.

A mask 5 (i.e., print screen) is made of a generally rectangular thin metal plate and is supported by a rectangularly shaped mask frame 6. The mask 5 is uniformly deposited so as to cover the lands 3 and conductive pattern 4. A plurality of openings $5a$ are formed in the mask 5, each of which corresponds to the associate land 3. Each opening $5a$ is used for printing a paste solder 7 as a bonding agent on the corresponding land 3. An isolator $5b$ having a predetermined width is formed between paired openings $5a$. Upon the spreading of paste solder 7 to the top surface of the mask 5 by means of a squeegee (not shown), the solder 7 is thereby supplied to the corresponding lands 3 through the associated openings $5a$.

This supply of the solder 7 to the lands 3 defines both a printed region $3a$ where the solder 7 is printed according to the shape of the opening $5a$ and a non-printed region $3b$ where the solder 7 is not printed corresponding to the shape of the isolator $5b$. The amount of solder 7 supplied on the printed region $3a$ is less than the amount of that required for printing on the entire land 3, and is determined by adjusting the ratio between the areas of printed region $3a$ and non-printed region $3b$, i.e., the ratio of between the opening $5a$ and the isolator $5b$.

The steps for printing paste solder on the lands by employing a mask having the above-described structure will now be described referring to FIGS. 2 and 3.

Figure 2:
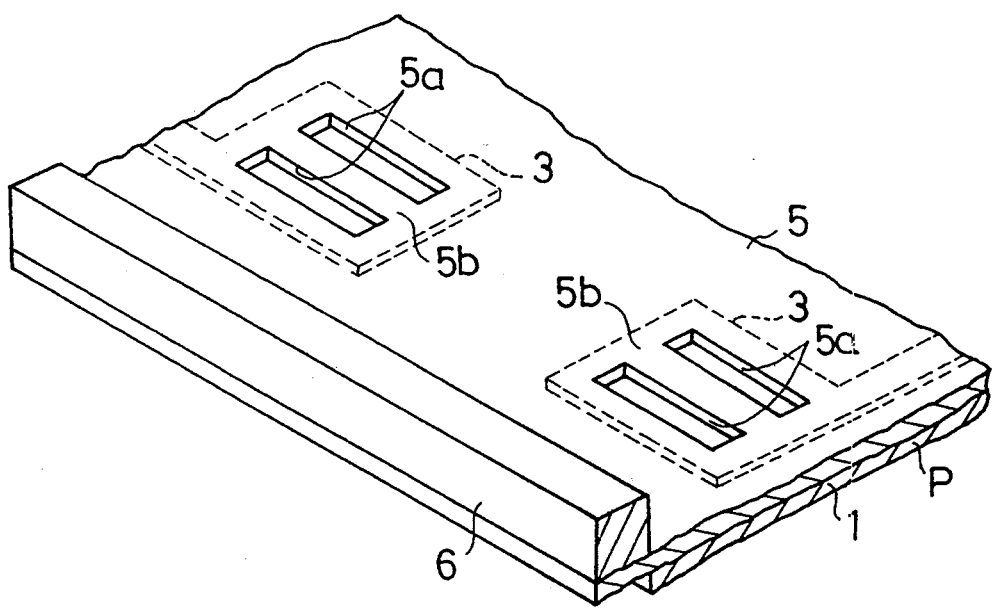
FIG. 2 is a schematic perspective view showing a mask which is placed on the printed circuit board of FIG. 1.

As shown in FIG. 2, the mask 5 is placed on the printed circuit board P such that the openings $5a$ face to the associate lands 3 formed on the board P. After the paste solder 7 is supplied to the top surface located at the end portion of the mask 5, the solder 7 is spread on the entire top surface of the mask 5 by means of the squeegee (not shown). Therefore, the solder 7 is printed on the lands 3 through the openings $5a$, respectively. After the mask 5 is removed, the solder 7 is placed at two separate locations on the land 3, as shown in FIG. 3. The printed region $3a$ corresponding to the opening $5a$ as well as the non-printed region $3b$ corresponding to the isolator $5a$ are then formed on the land 3.

Figure 3:
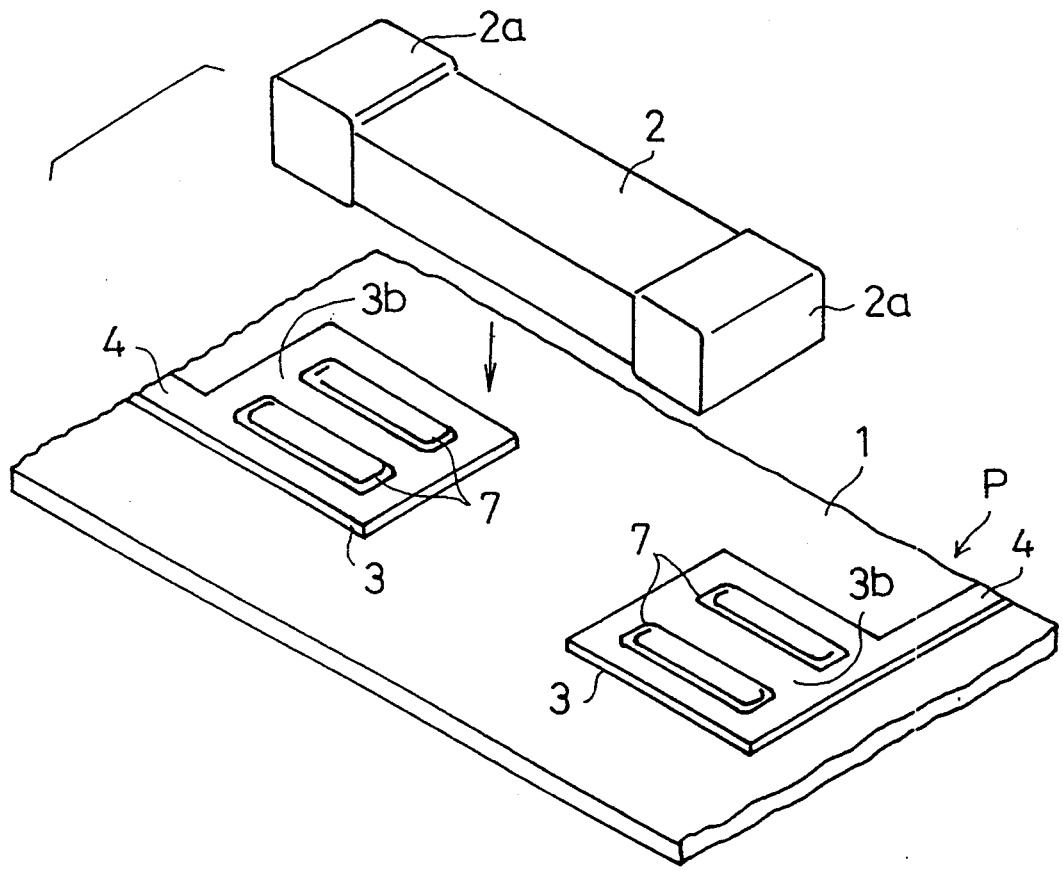
FIG. 3 is a schematic perspective view showing a chip component before being placed on the lands having the paste solder printed on the printed circuit board of FIG. 1.
Figure 4:
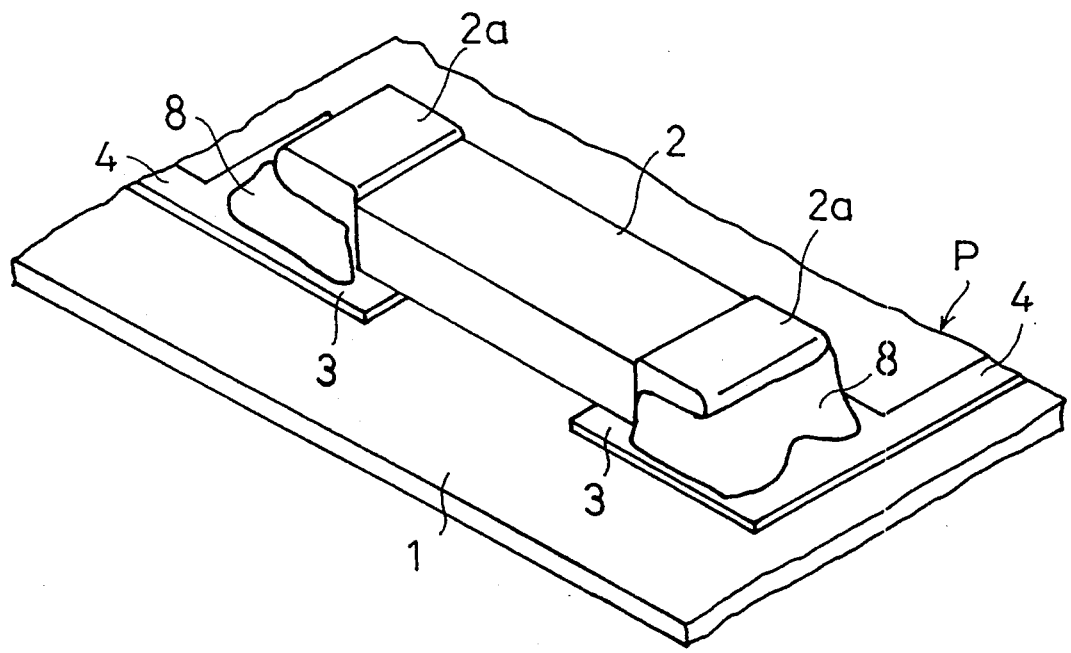
FIG. 4 is a schematic perspective view showing the chip component soldered to the lands of FIG. 3.

After the solder 7 is placed on the land 3, the chip component 2 is positioned and mounted on the printed region $3a$ by means of a chip mounting apparatus (not shown), as shown in FIGS. 3 and 4. At the same time, the solder 7 is depressed by the urging force applied to the chip component 2, and part of this depressed solder 7 is spread to the non-printed region $3b$. Therefore, the solder 7 is uniformly spread between the bottom surface of the chip component 2 and the top surface of the land 3. Then, the solder 7 is molten by a reflow soldering process. After the molten solder 7 is solidified, the chip component 2 is electrically connected with the corresponding land 3.

According to the above-described embodiment, the solder is uniformly provided between the bottom surface of the chip component 2 and the top surface of the corresponding land 3, before the solder is molten. Therefore, the solder 7 is not mounted over the top surfaces of the terminals 2a of the chip component 2 after the solder 7 is molten. As a result, solder fillets 8 having proper shapes are formed from each of the end portions of the chip component 2 to the corresponding land 3.

The amount of solder printed on the land 3 is determined according to the layout of the isolator $5b$ formed on the mask 5. Therefore, the amount of solder printed for each chip component 2, regardless of the size of the particular chip, can be easily adjusted by changing the layout thereof in a single mask. The simple processing of the isolator $5b$ in the mask 5 allows adjustment in the amount of printed solder, resulting in easy manufacturing and low cost.

Further, in as much as the isolator $5b$ is disposed between the pair of openings $5a$, the area of the printed region $3a$ formed by the supplied solder via both openings $5a$ is prevented from becoming too small in comparison with the entire area of the single land 3. Therefore, when the chip component 2 is mounted on the corresponding land 3, the dislocation between the terminals and the land 3 will not occur unlike the prior art. Even if slight dislocation occurs, improper connection between the terminals of the chip component 2 and the corresponding land 3 can be avoided due to the nominal amount of solder supplied to every land.

Although only one embodiment of the present invention has been described in detail herein, it should be apparent to those skilled in the art that the present invention may be embodied in many other specific forms without departing from the spirit or scope of the invention. Particularly, it should be understood that the following modes are applied.

As shown in FIGS. 5 through 8, to alternate the amount of solder to be supplied to each land, the shapes of openings and isolators can be changed. In the mask shown in FIG. 5, one side of the isolator 31b having a uniform width is enlarged as a horn shape, which is achieved by cutting away the opposing inner corners of adjacently disposed openings 31a. If this structure is applied, the amount of solder to form the printed region 3a can be reduced with comparison to the above-described embodiment.

Figure 5:
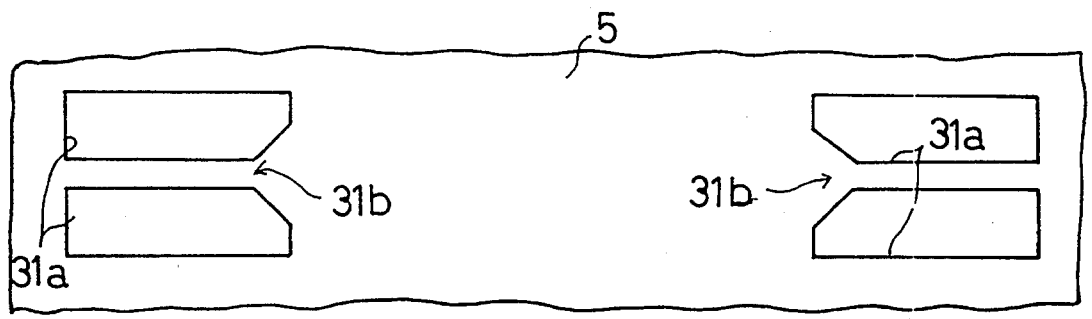
FIG. 5 is a partial plane view showing a first alternative example of a mask that is used in the printing method according to the present invention.
Figure 6:
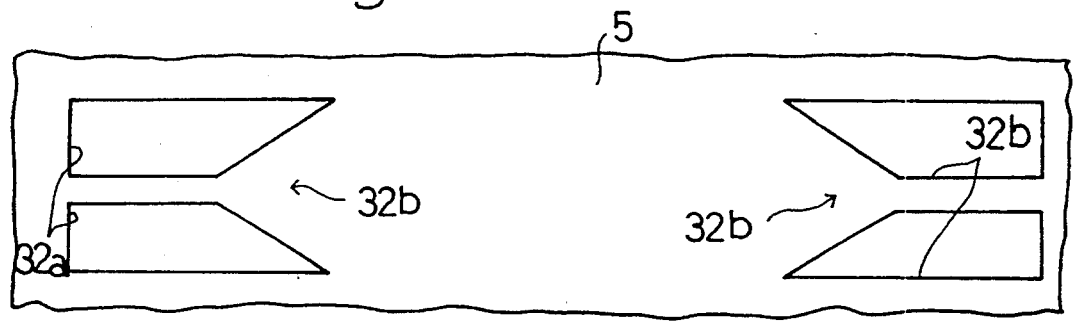
FIG. 6 is a partial plane view showing a second alternative example of a mask that is used in the printing method according to the present invention.

In the mask 5 shown in FIG. 6, opening 32a having larger cut away portion than the opening 31a of FIG. 5 is formed. Therefore, the horn shaped portion corresponding to the isolator 31b of FIG. 5 is so enlarged as to form an isolator 32b of FIG. 6.

Figure 7:
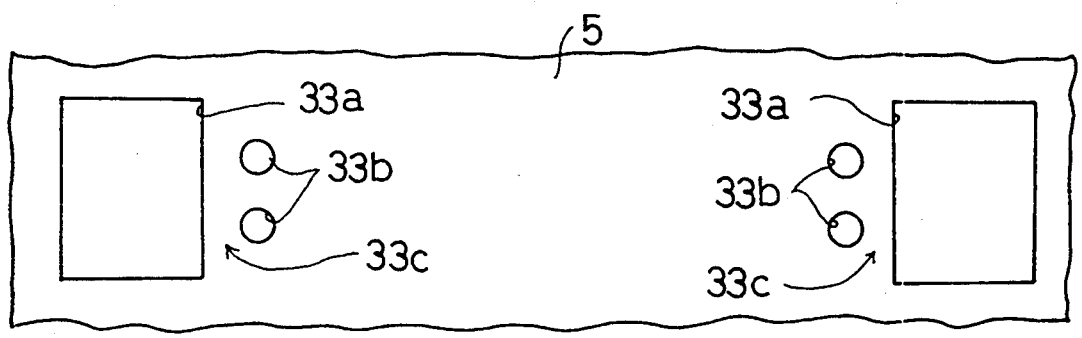
FIG. 7 is a partial plane view showing a third alternative example of a mask used in the printing method according to the present invention.

In the mask 5 shown in FIG. 7, a first opening 33a is formed. The first opening 33a has a rectangular shape, with the area thereof being smaller than that of the corresponding land 3. A pair of the second openings 33b having a circular shape are formed in the vicinity of the first opening 33a. The area between the first opening 33a and the second openings 33b is defined as an isolator 33c.

Figure 8:
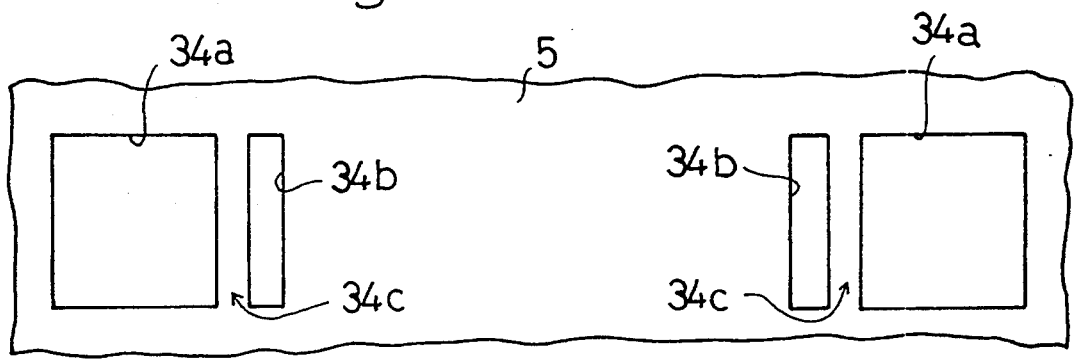
FIG. 8 is a partial plane view showing a fourth alternative example of a mask used in the printing method according to the present invention.
Figure 9:
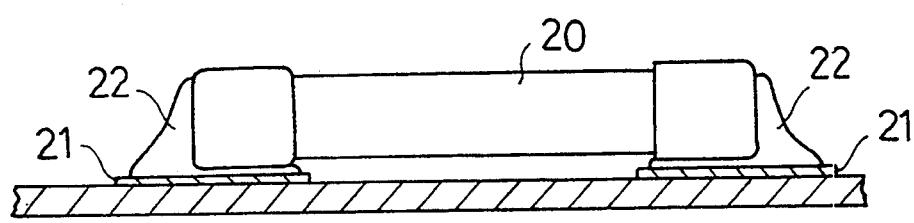
FIG. 9 is a schematic cross-sectional view showing properly shaped solder fillets formed by the printing method according to the present invention.
Figure 10:
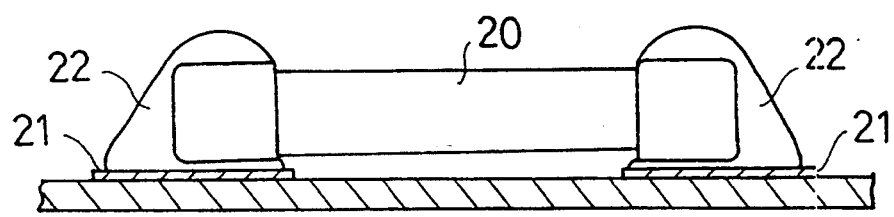
FIG. 10 is a schematic cross-sectional view showing solder fillets having improper fillet shapes formed by a conventional printing method.

In the mask 5 shown in FIG. 8, a first opening 34a is formed. The first opening 34a has a quadrilateral shape with the area thereof being smaller than that of the corresponding land 3. A second opening 34b having a rectangular shape with the length of its longitudinal edges being equal to that of the opening 34a is formed in the vicinity of the opening 34a. The area between the first and second openings 34a and 34b is defined as an isolator 34c.

Further, as a bonding agent, a silver or gold paste can be employed in place of solder. The substrate 1 can be made of ceramic material such as alumina. Chip inductor, chip thermistor and chip variable resistor can be employed as a chip component.

What is claimed is:

1. A method of mounting chip components on a substrate having electrically conductive lands formed on a top surface thereof which method comprises the steps of covering said lands with a printing screen having a printing pattern,
   forming a plurality of mutually separated bonding agent layers on said lands by applying said bonding agent to the lands through the printing pattern such that less than the full surface area of each of said lands is covered by said bonding agent layers;
   placing at least one of said chip components on said bonding agent layers; and
   pressing said chip components that have been placed on said bonding agent layers toward said land to spread said bonding agent layers on said lands prior to applying heat to said bonding agent layers.

2. A method according to claim 1, wherein said bonding agent, employed for forming said bonding agent layers, is solder.

3. A method according to claim 1, wherein a first bonding agent layer and a second bonding agent layer are formed spatially separated from each other during the formation of said bonding agent layers.

4. A method according to claim 3, wherein said first and second bonding agent layers have identical shapes.

5. A method according to claim 3, wherein said first and second bonding layers have different shapes.

6. A method according to claim 1, wherein said printing screen employed for forming said bonding agent layers has a plurality of openings which are similar to said bonding agent layers to be formed on said lands, and wherein said bonding agent is supplied to the lands through said openings.

7. A method of mounting chip components on a substrate having electrically conductive lands formed on a top surface thereof which method comprises the steps of covering said lands with a printing screen having a printing pattern;
   forming a plurality of mutually separated solder layers on said lands by employing said printing screen with a printing pattern which has a plurality of openings similar to the desired solder layers, and applying paste solder to said lands through said openings;
   placing said chip components on said solder layers; and
   pressing said chip components toward said lands to spread said solder layers on said lands prior to melting said solder layers.

* * * * *